(12) United States Patent
Sung

(10) Patent No.: US 6,238,977 B1
(45) Date of Patent: May 29, 2001

(54) METHOD FOR FABRICATING A NONVOLATILE MEMORY INCLUDING IMPLANTING THE SOURCE REGION, FORMING THE FIRST SPACERS, IMPLANTING THE DRAIN REGIONS, FORMING THE SECOND SPACERS, AND FORMING A SOURCE LINE ON THE SOURCE AND SECOND SPACERS

(75) Inventor: Kuo-Tung Sung, Hsinchu (TW)

(73) Assignee: United Integrated Circuits Corp, Hsinchu (TW)

( * ) Notice: Subject to any disclaimer, the term of this patent is extended or adjusted under 35 U.S.C. 154(b) by 0 days.

(21) Appl. No.: 09/282,015

(22) Filed: Mar. 29, 1999

(30) Foreign Application Priority Data

Mar. 5, 1999 (TW) .................................................. 88103369

(51) Int. Cl.$^7$ .................................................. H01L 21/336
(52) U.S. Cl. .......................... 438/261; 438/257; 438/258; 257/316; 257/324
(58) Field of Search .................................... 438/257, 258, 438/261, 264; 257/316, 319, 321, 324

(56) References Cited

U.S. PATENT DOCUMENTS

| | | | |
|---|---|---|---|
| 5,208,472 | * | 5/1993 | Su et al. ................................ 257/344 |
| 5,763,312 | * | 6/1998 | Jeng et al. ............................ 438/303 |
| 5,888,869 | * | 3/1999 | Cho et al. ............................. 438/258 |
| 5,888,870 | * | 3/1999 | Gardner et al. ...................... 438/261 |
| 6,017,796 | * | 1/2000 | Chen et al. ........................... 438/264 |

* cited by examiner

Primary Examiner—Charles Bowers
Assistant Examiner—William M. Brewster
(74) Attorney, Agent, or Firm—J.C. Patents; Jiawei Huang

(57) ABSTRACT

A method for fabricating in a non-volatile memory is provided. The method includes providing a substrate having a memory region. A stacked gate structure is formed on the substrate at the memory region. A source region is formed abutting the stacked gate structure, and an isolation structure is formed to isolate the source region, in which a drain region is also formed abutting the stacked gate structure on the opposite side but not actually related to the invention. A first spacer is formed on each sidewall of the stacked gate structure. A conductive layer is form over the substrate and is patterned to remove a portion of a conductive layer. A remaining portion of the conductive layer covers the isolation structure and the source region so as to form a source line, which has an electrical coupling to each source region belong to a same word line. The stacked gate structure is therefore exposed.

19 Claims, 5 Drawing Sheets

METHOD FOR FABRICATING A NONVOLATILE MEMORY INCLUDING IMPLANTING THE SOURCE REGION, FORMING THE FIRST SPACERS, IMPLANTING THE DRAIN REGIONS, FORMING THE SECOND SPACERS, AND FORMING A SOURCE LINE ON THE SOURCE AND SECOND SPACERS

CROSS-REFERENCE TO RELATED APPLICATION

This application claims the priority benefit of Taiwan application Ser. No. 88103369, filed Mar. 5, 1999, the full disclosure of which is incorporated herein by reference.

BACKGROUND OF THE INVENTION

1. Field of the Invention

This invention relates to semiconductor fabrication, and more particularly to a method for fabricating a source line so as to connect source regions of memory cells in a non-volatile memory.

2. Description of Related Art

Typically, several source regions abutting a word line of a non-volatile memory, such as a flash memory, are electrically coupled together by a source line and is usually formed by a self-aligned source (SAS) process. The SAS process includes, using formed stacked gates as a mask, removing field oxide (FOX) structures, which are originally used to isolate the source regions. The exposed portion of the substrate is implanted with ions so that the source region are electrically coupled together to form the source line.

As the device integration increases, the FOX structure is replaced by a shallow trench isolation (STI) structure. In this situation, the STI structure causes several problems on the SAS process to form a source line. Since an aspect ratio of the STI structure is large, it leaves a trench after the STI structure is removed. When a subsequent process to form a spacer for other elements, a trench spacer is also formed on each sidewall of the trench with a large thickness. A stress then occurs and particularly occurs on the corners to cause a leakage current. Moreover, if the trench depth is large, voids may easily occurs when the trench is filled with inter-layer dielectric (ILD) layer.

SUMMARY OF THE INVENTION

It is at least an objective of the present invention to provide a method for fabricating in a non-volatile memory. By forming a conductive layer on source regions and isolation structures, the source regions coupled together to form a source line without a conventional SAS process. Since the isolation structure, such as a STI structure, is not necessary to be removed, a leakage current is avoided and a poor performance of step coverage is also avoided during forming an inter-layer dielectric (ILD) layer.

In accordance with the foregoing and other objectives of the present invention, a method for fabricating in a non-volatile memory is provided. The method includes providing a substrate having a memory region. An isolation structure is first formed on the substrate. A stacked gate structure is then formed on the substrate at the memory region. A source region is formed abutting the stacked gate structure, while it is still not continuous due to a separation from the isolation structure. A drain region is also formed abutting the stacked gate structure on the opposite side but not actually related to the invention. A first spacer is formed on each sidewall of the stacked gate structure. A conductive layer is formed over the substrate and is patterned to remove a portion of the conductive layer. A remaining portion of the conductive layer covers the isolation structure and the source region so as to form a source line, which has an electrical coupling to each source region belonging to a same source line. The stacked gate structure is therefore exposed.

In the foregoing, the conductive layer includes, for example, titanium, titanium/titanium-nitride, Cobalt, tungsten, or other metallic material, and has a thickness of about 500–1000 angstroms. The conductive can be patterned by including, for example, forming a dielectric layer on the conductive layer. A portion of the dielectric layer other than the source region and the isolation structure is removed to exposed a portion of the conductive layer. Using the patterned dielectric layer as an etching mask, the exposed portion of the conductive layer is removed by, for example, wet etching. The remaining portion of the conductive forms a source line to connect several source regions.

During fabricating the memory region, a logic region on the substrate is usually simultaneously fabricated. The method of the invention is also suitable for this manner. In the above fabrication process, when the stacked gate structure is formed, an usual gate is also formed on the substrate at the logic region. Before the first spacer is formed, using the stacked gate structure as a mask, a first doping process is performed to pre-form a source region abutting the stacked gate structure. Using the usual gate structure at the logic region as a mask, a lightly doping process is performed so as to form a lightly doped drain (LDD) structure. A second spacer on each sidewall of the usual gate at the logic region is formed. Using the stacked gate structure and the usual gate with the second spacer as a mask, a second doping process is performed to formed desired source/drain regions at the memory region and the logic region. The first spacer is then formed on each sidewall of the stacked gate structure and the rest processes of the invention described above are performed to form the source line.

In the invention, the source line is formed without including a conventional SAS process. There is no need of a process to removed the isolation structure, a leakage current is avoided. A better step coverage performance is achieved when an ILD layer is formed, in which the improvement is more obvious for a STI structure.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

A read-only memory (ROM) usually also called a non-volatile memory, which includes various structure. One of the most common non-volatile memory is a flash memory. In these descriptions of the invention to form a source line, a flash memory is used as an example for descriptions.

Figure 1:
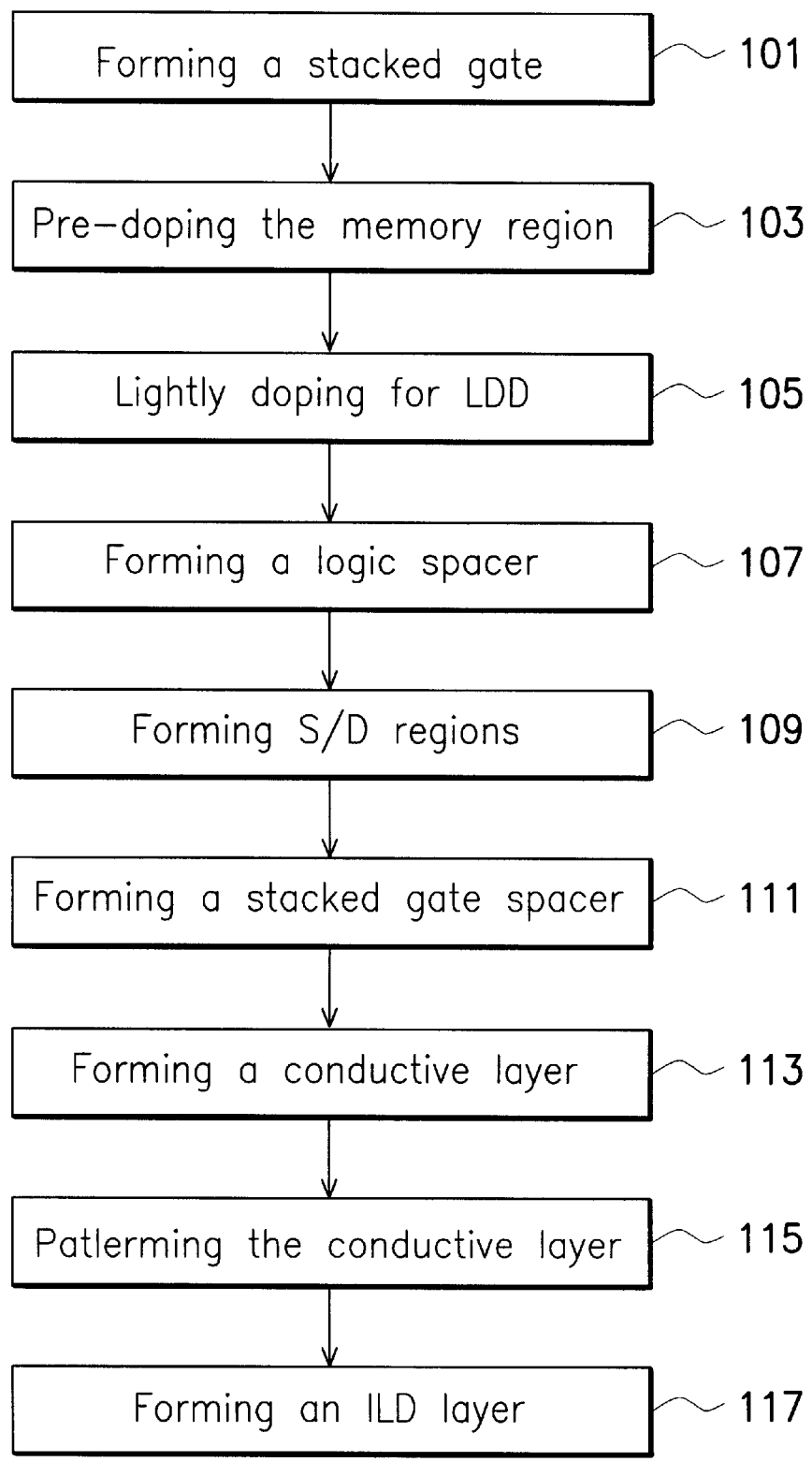
FIG. 1 is a flow diagram, schematically illustrating a fabrication flow of a source line in a non-volatile memory, according to a preferred embodiment of the invention.

FIG. 1 is a flow diagram, schematically illustrating a fabrication flow of a source line in a non-volatile memory, according to a preferred embodiment of the invention. FIGS. 2A–2D are top views of a portion of a substrate, schematically illustrating a fabrication process for forming a source line in a non-volatile memory, according to a preferred embodiment of the invention. FIGS. 3A–3D are cross-sectional views, taken along with a line III—III on the substrate with respect to FIGS. 2A–2D.

Figure 2A:
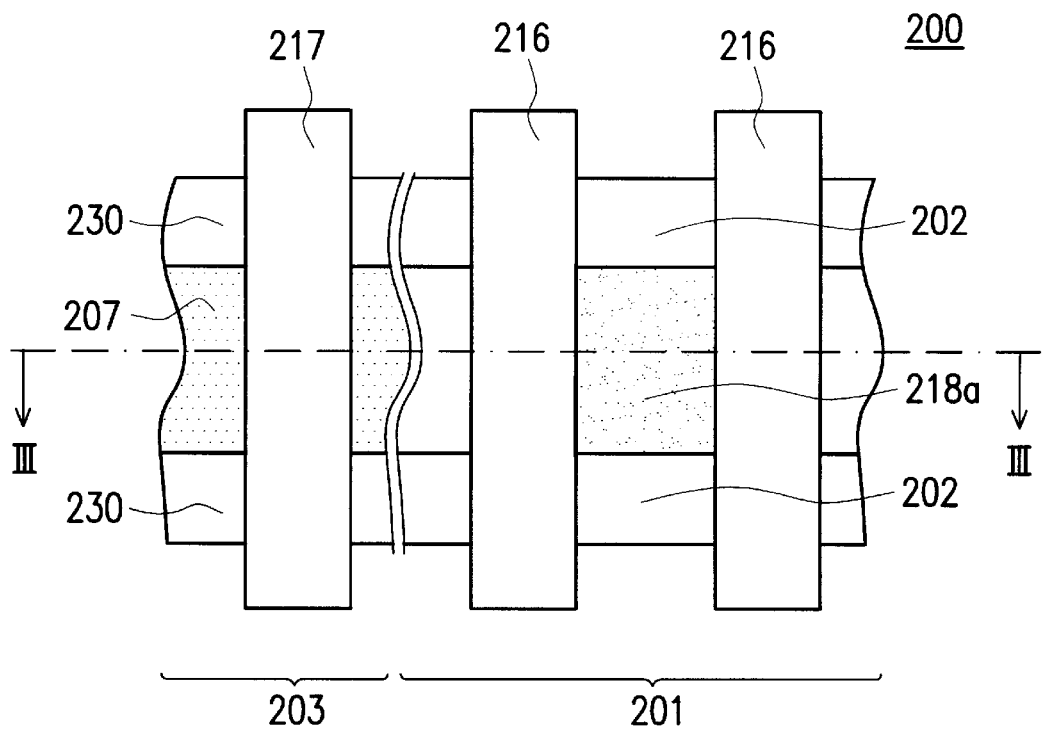
FIGS. 2A–2D are top views of a portion of a substrate, schematically illustrating a fabrication process for forming a source line in a non-volatile memory, according to a preferred embodiment of the invention.
Figure 3A:
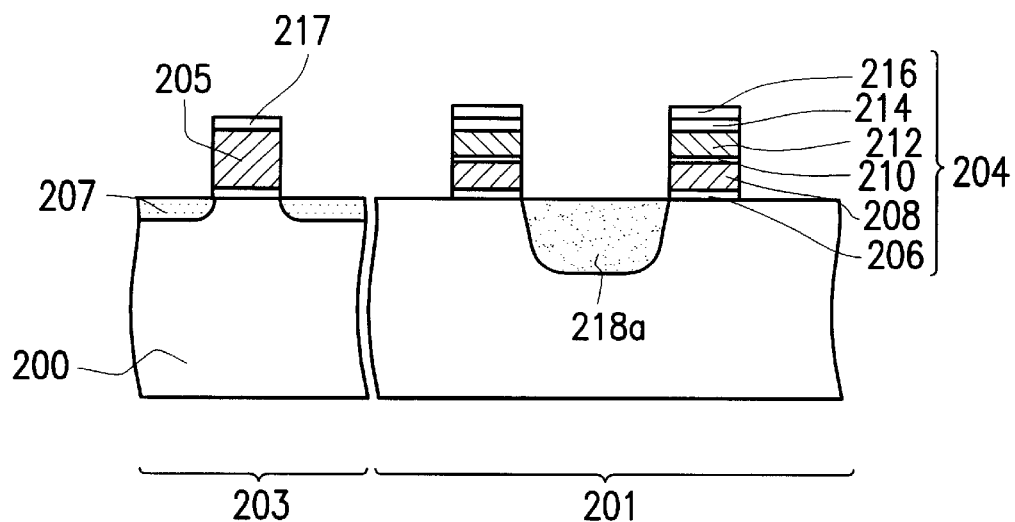
FIGS. 3A–3D are cross-sectional views, taken along with a line III—III on the substrate with respect to FIGS. 2A–2D.
Figure 3B:
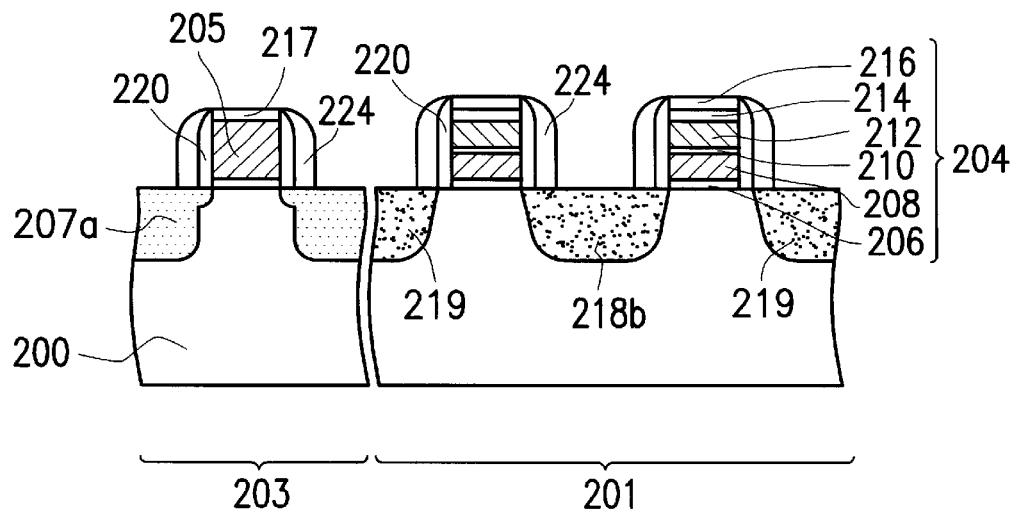

In FIG. 1, FIG. 2A, and FIG. 3A, a flash memory is fabricated. First, a semiconductor substrate 200 including a memory region 201 and a logic region 203 is provided. A step 101 is performed to form a stacked gate structure 204 at the memory region 201, in which a logic gate structure 205 and a dielectric layer 217 on the logic gate structure 205 are also formed at the logic region 203 during forming the stacked gate structure 204, An isolation structure 202 at the memory region 201 and an isolation structure 230 at the logic region 203 are formed to pattern active regions in between. The stacked gate structure including, for example, a tunneling oxide layer 206, a first polysilicon layer 208, a dielectric film layer 210, a second polysilicon layer 212, an optional silicide layer 214, and a dielectric layer 216 are sequentially formed on the substrate at the memory region 201 and are patterned to form the stacked gate structure 204. The silicide layer 214 is optionally formed, and if it is formed, it includes, for example, $TiSi_x$, The dielectric film layer 210 includes, for example, a silicon-oxide/silicon-nitride/silicon-oxide (O/N/O) structure. The dielectric layer 216 includes silicon oxide.

The logic gate structure 205 includes a gate oxide and a polysilicon gate as usual. The polysilicon gate can be simultaneously formed with the formation of the second polysilicon layer 212. The silicide layer 214, which is optional, can be on top of the second polysilicon layer 212. Usually, a logic gate needs silicide but a flash cell needs no silicide. The dielectric layer 217 includes, for example, silicon oxide.

A step 103 is performed to pre-doping the substrate 200 at the memory region 201, using the stacked gate structure 204, so that a source region 218a is formed in the substrate 200 between two stacked gates 204 by, for example, ion implantation. A step 105 of lightly doping process is performed to form a lightly doped region 207 for a lightly doped drain (LDD) structure in the substrate at each side of the logic gate structure 205.

Figure 2B:
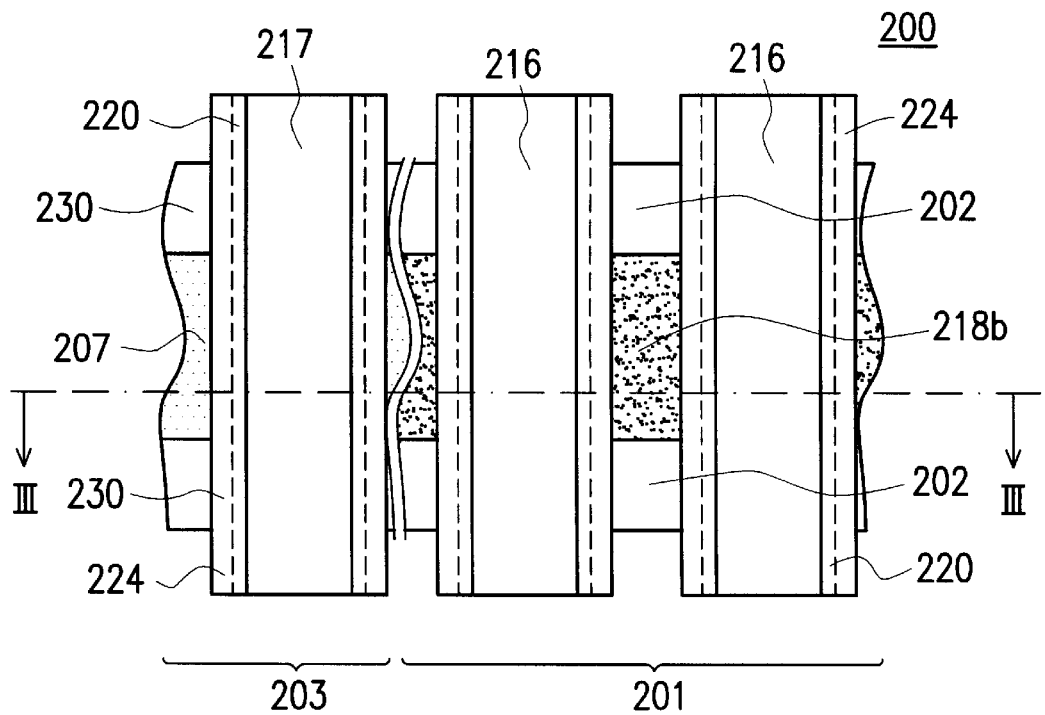
Figure 2C:
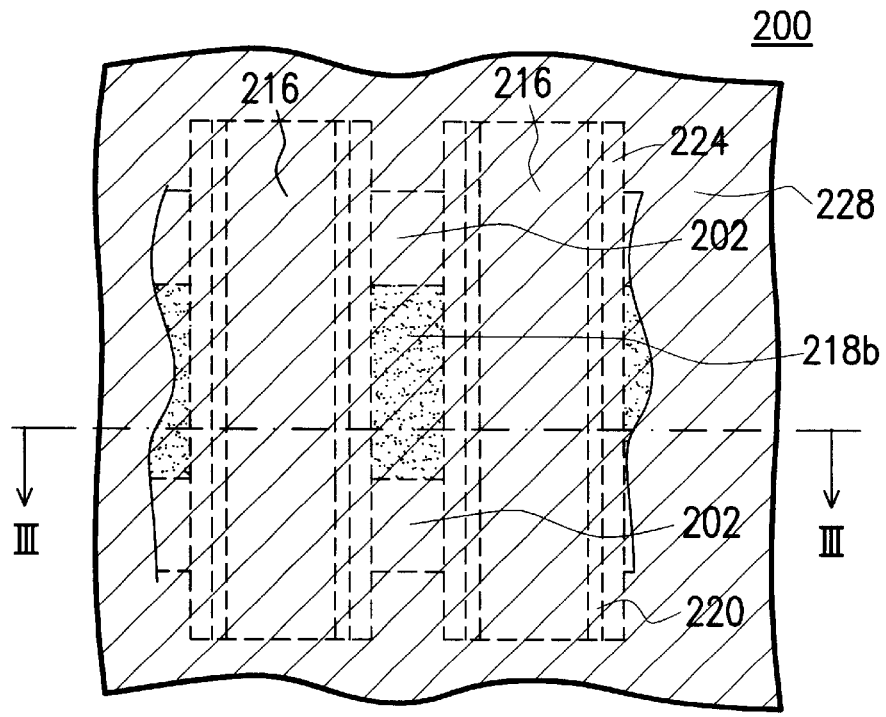

In FIG. 2B and FIG. 2C, referring to step 107, a spacer 220 is formed on each sidewall of the logic gate structure 205 with the dielectric layer 217 and the stacked gate structure 204. Referring to step 109, a doping process, such as an ion implantation, is performed to form a source region 218b by further doping the source region 218a of FIG. 3A and a drain region 219 on the opposite side of the stacked gate structure 204. Simultaneously, a source/drain region 207a, which is for an inside cell and is not interchangeable, with the LDD structure is formed at each side of the logic gate structure 205. The spacer 220 is formed by first forming a preliminary dielectric layer (not shown) over the substrate 200, and performing an etching back process to remove the preliminary dielectric layer. A remaining portion of the preliminary dielectric layer form the spacer 220. The etching back process includes, for example, a dry anisotropic etching process. The spacer 220 includes, for example, silicon oxide and has a thickness of about 1000 angstroms.

The doping process in step 109 includes, for example, ion implantation, using the stacked gate structure 204, the gate structure 205 with the dielectric layer 217, and the spacer 220 as a mask. In step 111, similar to the formation of the spacer 220, a spacer 224 is formed on the spacer 220. The spacer 224 has a thickness of about 1000–3000 angstroms The purpose of the spacer 224 is to have a better isolation on the stacked gate structure 204 as a conductive layer 226 is subsequently formed in FIG. 3C.

In the above descriptions, the steps 105–109 are related to form a conventional logic device, such as a formed logic transistor formed in these steps, and are not affect the method of the invention, which is basically characterized the steps 101, 103, and other steps from the step 11. Any further process on the logic region, such as a self-aligned silicide (Salicide) process may also included. In the following figures, the logic region 203 is shown. Only the memory region 201 related to the invention are described.

Figure 3C:
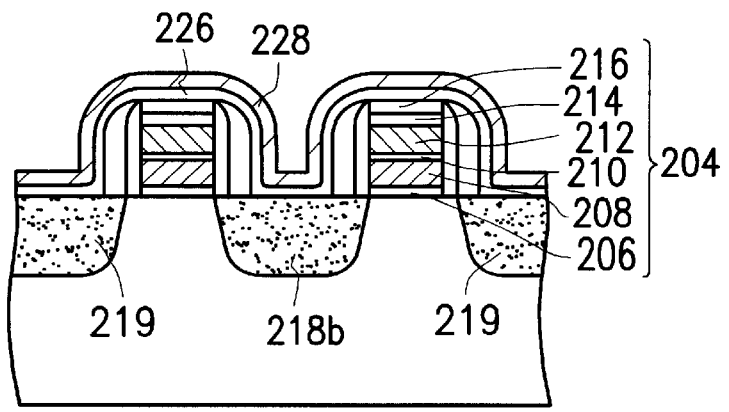

In FIG. 2C, FIG. 3C, and step 113, a conductive layer 226 is formed over the substrate 200. The conductive layer 226 includes, for example, titanium, titanium/titanium-nitride, tungsten, cobalt, or other metallic material, in which titanium/titanium-nitride is preferred. The conductive layer 226 also preferably includes a thickness of about 500–1000 angstroms formed by, for example, physical vapor deposition (PVD), chemical vapor deposition (CVD), or sputtering deposition, in which sputtering deposition is preferred. The conductive layer 226 has electrical couplings to each source region 218b belonging to a same source line that is to be formed later. A mask layer 228, such as a photoresist layer or a dielectric layer, is formed on the conductive layer 226. Then, the conductive layer 226 is patterned by, for example, photolithography and etching, in which the etching preferably includes dry etching. The material included in the mask layer 228 depends on the metallic material used in the conductive layer 226. For example, if the conductive layer 226 includes titanium, titanium/titanium-nitride, tungsten, cobalt, an etchant used in the etching process usually includes ammonia ($NH_3$), which also corrodes the photoresist layer. In this situation, a dielectric layer including, for example, silicon oxide or silicon nitride, is alternatively used. If the mask layer 228 is desired to include dielectric, it can include, for example, silicon oxide or silicon nitride and is formed by, for example, CVD.

Figure 2D:
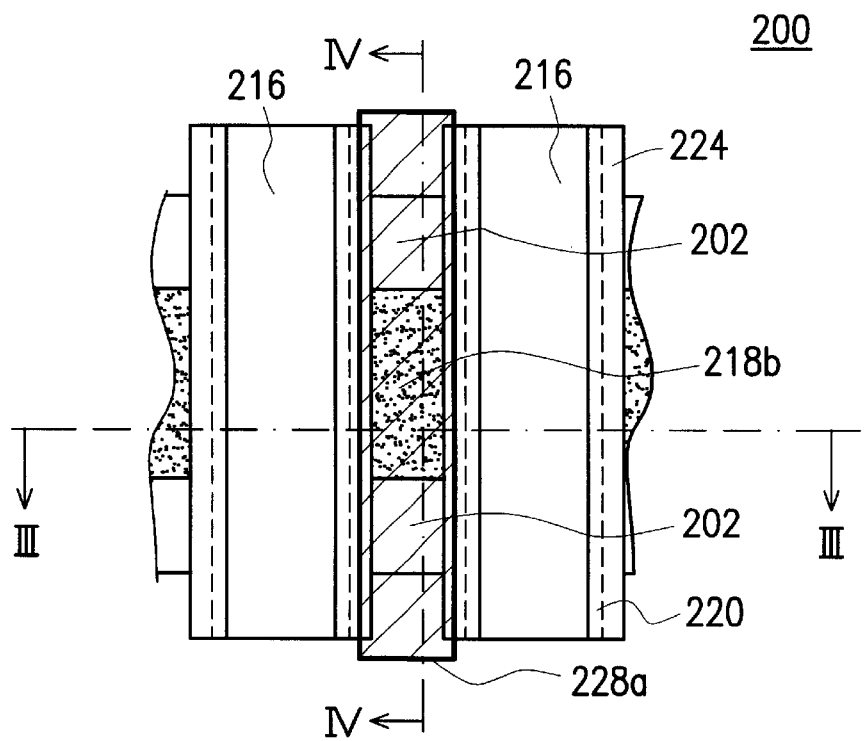
Figure 3D:
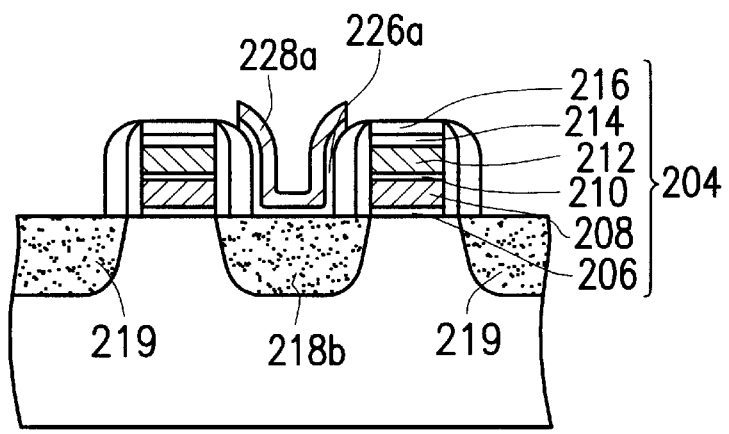
Figure 4:
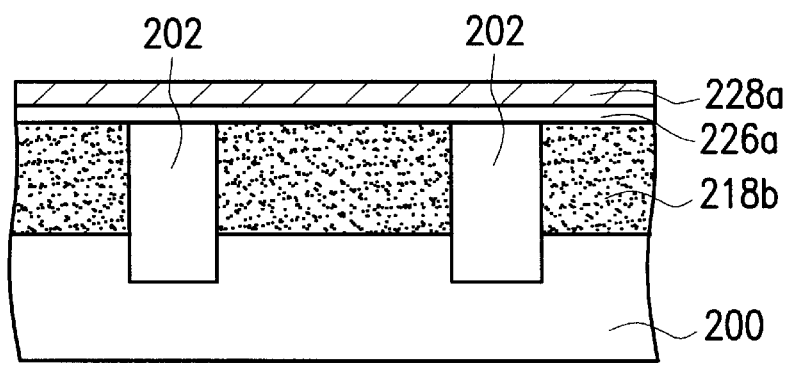
FIG. 4 is a cross-sectional view, taken along with a line IV—IV on the substrate in FIG. 2D.

FIG. 2D and FIG. 3D, referring to step 115, the mask layer 228 is patterned to form a mask layer 228a, which just about covers the spacer 224 (FIG. 3B), the source region 218b, and a portion of the isolation structure 202 so that a portion of the conductive layer 226 is exposed. Using the mask layer 228a as an etching mask, an etching process, such as a wet etching process, is performed to remove the exposed portion of the conductive layer 226 so as to form a conductive layer 226a. The conductive layer 226a serving as a source line has couplings to each source region 218b belonging to this source line. The source line usually is parallel to a word line to form a common source for several memory transistors belong to a same word line. The conductive layer 228a can also be seen in FIG. 4, which is a cross-sectional view, taken along with a line IV—IV on the substrate in FIG. 2D. In FIG. 4, the conductive layer 226a cross each individual source region 218b. Each source region 218a is isolated by the isolation structure 202, such as the STI structure 202. The source line provided by the invention needs not to remove the STI structure 202. If the mask layer 228a includes photoresist, it is necessary to be removed before a subsequent process, which can be, for example, forming an inter-layer dielectric (ILD) layer. If the mask layer 228a includes dielectric material, it may be not necessary to be removed but preferably be removed.

In FIG. 1, in step 117, an ILD layer, for example, is subsequently formed over the substrate. Since the STI structure 202 is not removed, the formation of the ILD layer can be easily formed over the substrate without worrying about a poor step coverage ability to fill the trench, which remains if the STI structure 202 is removed. A leakage current due to the trench is also avoided.

In conclusion, the invention has several characteristics as follows:

1. The conductive layer 226a is formed over the isolation structure 202 and each related source region 218b so as to serve as a source line. There is no need of a conventional SAS process.

2. Since the STI structure 202 is not removed, there is no trench to be filled during forming the conductive layer 226a. There is no leakage current due to the trench.

3. Since the STI structure 202 is not removed, there is no poor performance of step coverage when the ILD layer is formed.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method of fabricating a source line in a non-volatile memory, suitable for use on a substrate having a memory region, a line stacked structure formed on the substrate at the memory region, a plurality of isolation structures and a plurality of source regions and drain regions abutting alternate sides of the line stacked gate structure, the method comprising:

forming a first spacer on each sidewall of the line stacked gate structure after a first ion implantation step for forming a primary source region;

performing a second ion implantation on the primary source regions to form the source regions; and simultaneously, for forming the drain regions;

forming a second spacer on the first spacer;

forming a conductive layer over the substrate; and patterning the tunneling oxide layer, the first polysilicon layer, the dielectric film layer, the second polysilicon layer, and the dielectric layer so as to form the line stacked gate structure.

2. The method of claim 1, wherein the conductive layer comprises titanium, titanium nitride, tungsten, cobalt, or other metallic material.

3. The method of claim 1, wherein the step of form the conductive layer over the substrate comprises sputtering deposition.

4. The method of claim 1, wherein the step of form the conductive layer over the substrate comprises chemical vapor deposition (CVD).

5. The method of claim 1, wherein the step of form the conductive layer over the substrate comprises physical vapor deposition (PVD).

6. The method of claim 1, wherein the conductive layer comprises a thickness of about 500–1000 angstroms.

7. The method of claim 1, wherein the step of patterning the conductive layer comprises photolithography and etching processes.

8. The method of claim 7, wherein the photolithography and etching processes comprise a dry etching process.

9. The method of claim 1, wherein the step of patterning the conductive layer comprises:

forming a mask dielectric layer on the conductive layer, patterning the mask dielectric layer so that a remaining portion of the dielectric layer about covers a portion of the conductive layer above the isolation structure, the first spacer, and the source regions;

removing a portion of the conductive layer, using the mask dielectric layer as a mask layer so that a remaining portion of the conductive layer forms the source line.

10. The method of claim 9, wherein the dielectric layer comprises silicon oxide or silicon nitride.

11. The method of claim 1, wherein each of the isolation structures comprises a shallow trench isolation (STI) structure.

12. The method of claim 1, wherein a formation of the line stacked gate structure comprises:

forming a tunneling oxide layer on the substrate;

forming a first polysilicon layer on the tunneling oxide layer;

forming a dielectric film layer on the first polysilicon layer;

forming a second polysilicon layer on the dielectric film layer;

forming a dielectric layer on the second polysilicon layer; and patterning the tunneling oxide layer, the first polysilicon layer, the dielectric film layer, the second polysilicon layer, and the dielectric layer so as to form the line stacked gate structure.

13. The method of claim 12, wherein the substrate further comprises a logic region, and a logic gate structure at the logic region is simultaneously formed during the formation of the line stacked gate structure at the memory region.

14. The method of claim 13, wherein before the step of forming the first spacer, the method further comprises:

the step of the first ion implantation using the line stacked gate structure as a mask, to pre-form the primary source regions on a desired region at the memory region;

performing a lightly doping process at the logic region so as to form a lightly doped drain (LDD) structure at each side of the logic gate structure; and the step of performing the second ion implantation process to formed the source and drain regions, using the line stacked gate structure, the logic gate structure, the first spacer and the second spacer as a mask.

15. The method of claim 1, wherein the first spacer is thinner than the second spacer.

16. The method of claim 1, wherein the first spacer has a thickness of about 1000 angstroms.

17. The method of claim 1, wherein the second spacer has a thickness of about 1000 to about 3000 angstroms.

18. The method of claim 1, wherein the first spacer comprises silicon oxide.

19. The method of claim 1, wherein after the step of patterning the conductive layer, the method further comprises:

removing a remaining undesired layer on the remaining portion of the conductive layer if there is any; and forming an inter-layer dielectric layer over the substrate.

* * * * *